United States Patent [19]
Utsugi et al.

[11] Patent Number: 6,094,392
[45] Date of Patent: Jul. 25, 2000

[54] SEMICONDUCTOR MEMORY DEVICE

[75] Inventors: Satoshi Utsugi; Masami Hanyu; Tadahiko Sugibayashi, all of Tokyo, Japan

[73] Assignee: NEC Corporation, Tokyo, Japan

[21] Appl. No.: 09/393,807

[22] Filed: Sep. 10, 1999

[30] Foreign Application Priority Data

Sep. 10, 1998 [JP] Japan .................................. 10-256656

[51] Int. Cl.⁷ .................................................. G11C 7/00
[52] U.S. Cl. ...................................... 365/203; 365/189.11
[58] Field of Search .............................. 365/203, 189.11, 365/154, 207

[56] References Cited

U.S. PATENT DOCUMENTS

| | | | |
|---|---|---|---|
| 5,675,529 | 10/1997 | Poole | 365/203 |
| 5,796,665 | 8/1998 | Ternullo, Jr. et al. | 365/203 |
| 5,930,197 | 7/1999 | Ishibashi et al. | 365/203 |
| 6,018,486 | 6/2000 | Ferrant | 365/203 |

FOREIGN PATENT DOCUMENTS

| | | |
|---|---|---|
| 4-274081 | 9/1992 | Japan . |
| 5-250875 | 9/1993 | Japan . |
| 7-211059 | 8/1995 | Japan . |
| 9-82086 | 3/1997 | Japan . |

*Primary Examiner*—Son T. Dinh
*Attorney, Agent, or Firm*—Sughrue, Mion, Zinn, Macpeak & Seas, PLLC

[57] ABSTRACT

A plurality of bit line pairs are provided in a semiconductor memory device. A plurality of memory cells are connected to the first bit line pairs. Also, in the semiconductor memory device, there are provided a first sense amplifier, a second bit line pair and a second sense amplifier. The first sense amplifier reads and amplifies a potential difference between the first bit line pair. A signal output from the first sense amplifier is transmitted to the second bit line pair. The second sense amplifier amplifies a potential difference between the second bit line pair. A precharge circuit is built in the second sense amplifier. The first bit line pairs are precharged by the precharge circuit.

8 Claims, 5 Drawing Sheets

SEMICONDUCTOR MEMORY DEVICE

BACKGROUND OF THE INVENTION

1. Field of the Invention

The present invention relates to a semiconductor memory device which is suitable for a dynamic random access memory having a bit line structure of a hierarchic type, and more particularly to a semiconductor memory device whose chip size has been reduced.

2. Description of the Related Art

A memory capacity of a dynamic random access memory (DRAM) is increasing year after year, and a prototype of a DRAM having a capacity of 4 Gb has been manufactured and made public. Such an increase in memory capacity can be realized by reducing of an area of each memory cell and decreasing pitches of word lines and bit lines. Along with this, a demand is made to reduce the size of a sense amplifier.

In order to meet this demand, there has been proposed a DRAM having a bit line structure of a hierarchic type and a shared sub sense amplifier. FIG. 1 is a circuit diagram showing a conventional semiconductor memory device.

In the conventional semiconductor memory device, two main bit lines MBLN11 and MBLT11 are connected to a main sense amplifier MSA11. A sub sense amplifier SSA11-0 is connected between the main bit lines MBLT11 and MBLN11. A signal line WSL11 for a writing switch signal, a signal line RSL11 for a reading switch signal, a signal line PDL11 for a precharge balance signal and a middle potential signal line HVCL11 through which a middle potential between a high potential and a low potential is transmitted are connected to the sub sense amplifier SSA11-0. A precharge circuit PCC11 attached with the signal line PDL11 for the precharge balance signal and the middle potential signal line HVCL11 is provided in the sub sense amplifier SSA11-0.

Also, eight sub bit lines SBLT10, SBLT11, SBLT12, SBLT13, SBLN10, SBLN11, SBLN12 and SBLN13 are connected to the sub sense amplifier SSA11-0. The four sub bit lines SBLT10, SBLT11, SBLT12 and SBLT13A are intersected by a word line WL10. A memory cell connected to each of the sub bit lines and the word line WL10 is provided on each of these intersection points. Similarly, the four sub bit lines SBLN10, SBLN11, SBLN12 and SBLN13a are intersected by a word line WL11. A memory cell connected to each of the sub bit lines and the word line WL11 is provided on each of these intersection points. One MOS transistor is connected between each of these eight memory cells and the sub sense amplifier SSA11-0.

Signal lines TGL10 for a signal for a sub bit line separation signal are respectively connected to the gates of the respective MOS transistors connected to the sub bit line SBLT10 or SBLN10. Signal lines TGL11 for a sub bit line separation signal are respectively connected to the gates of the respective MOS transistors connected to the sub bit line SBLT11 or SBLN11. Signal lines TGL12 for a sub bit line separation signal are respectively connected to the gates of the respective MOS transistors connected to the sub bit line SBLT12 or SBLN12. Signal lines TGL13 for a sub bit line separation signal are respectively connected to the gates of the respective MOS transistors connected to the sub bit line SBLT13 or SBLN13.

The main sense amplifier MSA11 is shared by a plurality of sub sense amplifiers such as the sub sense amplifier SSA11-0. As a consequence, DRAM has a bit line structure of a hierarchic type. Thus, the sense amplifier is reduced in size as a whole.

In the conventional semiconductor memory device thus constituted, the sub sense amplifier is precharged by a precharge circuit provided in each of the sub sense amplifiers. For example, the sub sense amplifier SSA11-0 is precharged by the precharge circuit PCC11.

Furthermore, there has been proposed a semiconductor memory device in which noises have been reduced and stability in operation has been improved (Japanese Unexamined Patent Application Laid-Open No. Hei 4-274081). FIG. 2 is a block diagram showing a conventional semiconductor memory device disclosed in the Japanese Patent Application Laid-Open No. Hei 4-274081.

In the conventional semiconductor memory device disclosed in the Japanese Patent Application Laid-Open No. Hei 4-274081, two main bit lines MBLN21 and MBLT21 are connected to main sense amplifiers MSA21 and MSA22. Sub sense amplifiers SSA21, SSA22 and a precharge circuit PCC21 are connected between the main bit lines MBLT21 and MBLN21. A signal line PDL21 to which a precharge balance signal for controlling operation of the precharge circuit PCC21 is transmitted from the outside is connected to the precharge circuit PCC21. Furthermore, a middle potential signal line HVCL21 to which a potential between the high potential and the low potential is transmitted is connected to the precharge circuit PCC21. A pair of sub bit lines (not shown) are connected to the sub sense amplifiers SSA21 and SSA22. A plurality of word lines (not shown) intersect the pair of sub bit lines. Then, on an intersection point of each sub bit line and each word line, a memory cell (not shown) connected to the bit lines and the word line is provided.

In the conventional semiconductor memory device disclosed in the Japanese Patent Application Laid-Open No. Hei 4-274081, the main sense amplifiers MSA21 and MSA22 are precharged and the sub sense amplifiers SSA21 and SSA22 are also precharged with a change in the potential of the precharge balance.

However, in the conventional semiconductor memory device in which the precharge circuit PCC11 is provided in the sub sense amplifier SSA11-0, the sub sense amplifier is not sufficiently reduced in size.

Also, the conventional semiconductor memory device disclosed in the Japanese Patent Application Laid-Open No. Hei 4-274081, has attained its expected purpose, but it is not sufficiently applicable to a further fine structure in these days.

SUMMARY OF THE INVENTION

An object of the present invention is to provide a semiconductor memory device whose chip size can be further finely structured.

According to one aspect of the present invention, a semiconductor memory device may comprise a plurality of first bit line pairs, a plurality of memory cells connected to the first bit line pairs, a first sense amplifier which reads and amplifies a potential difference between the first bit line pair, a second bit line pair to which a signal output from the first sense amplifier is transmitted, a second sense amplifier which amplifies a potential difference between the second bit line pair, and a precharge circuit built in the second sense amplifier. The precharge circuit conducts precharge of the first bit line pairs.

According to the present invention, the precharge circuit which conducts precharge of the first bit line pairs is built in the second sense amplifier. Therefore, an overall area of the semiconductor memory device is reduced in a case in which a plurality of the first sense amplifiers are provided, as compared with a case in which the precharge circuit is provided in each of the first sense amplifiers. Also, since the plurality of first bit line pairs are shared with the first sense amplifiers, the chip size of the memory can be further finely structured.

The first sense amplifier can have an open bit line structure or a fall-dead bit line structure.

The precharge circuit can have a precharge potential signal line to which a potential for precharge is transmitted during said precharge. The potential for precharge is applied to the first bit line pairs. The precharge circuit may further have first and second MOS transistors having source-drain connected to the precharge potential signal line. The first and second MOS transistors are connected in series between the second bit line pair. The precharge circuit may further comprise a precharge control signal line which is connected to gates of the first and second MOS transistors. The precharge control signal for controlling the precharge is transmitted to the precharge control signal line. The precharge circuit can include a third MOS transistor whose gate is connected to the precharge control signal line, and whose both of source-drains are connected to the second bit line pair.

Furthermore, the semiconductor memory device described above may be used for a dynamic random access memory.

Still further, the first sense amplifier can have a switching element which controls conduction and non-conduction between the first bit line pair.

DESCRIPTION OF PREFERRED EMBODIMENTS

Figure 1:
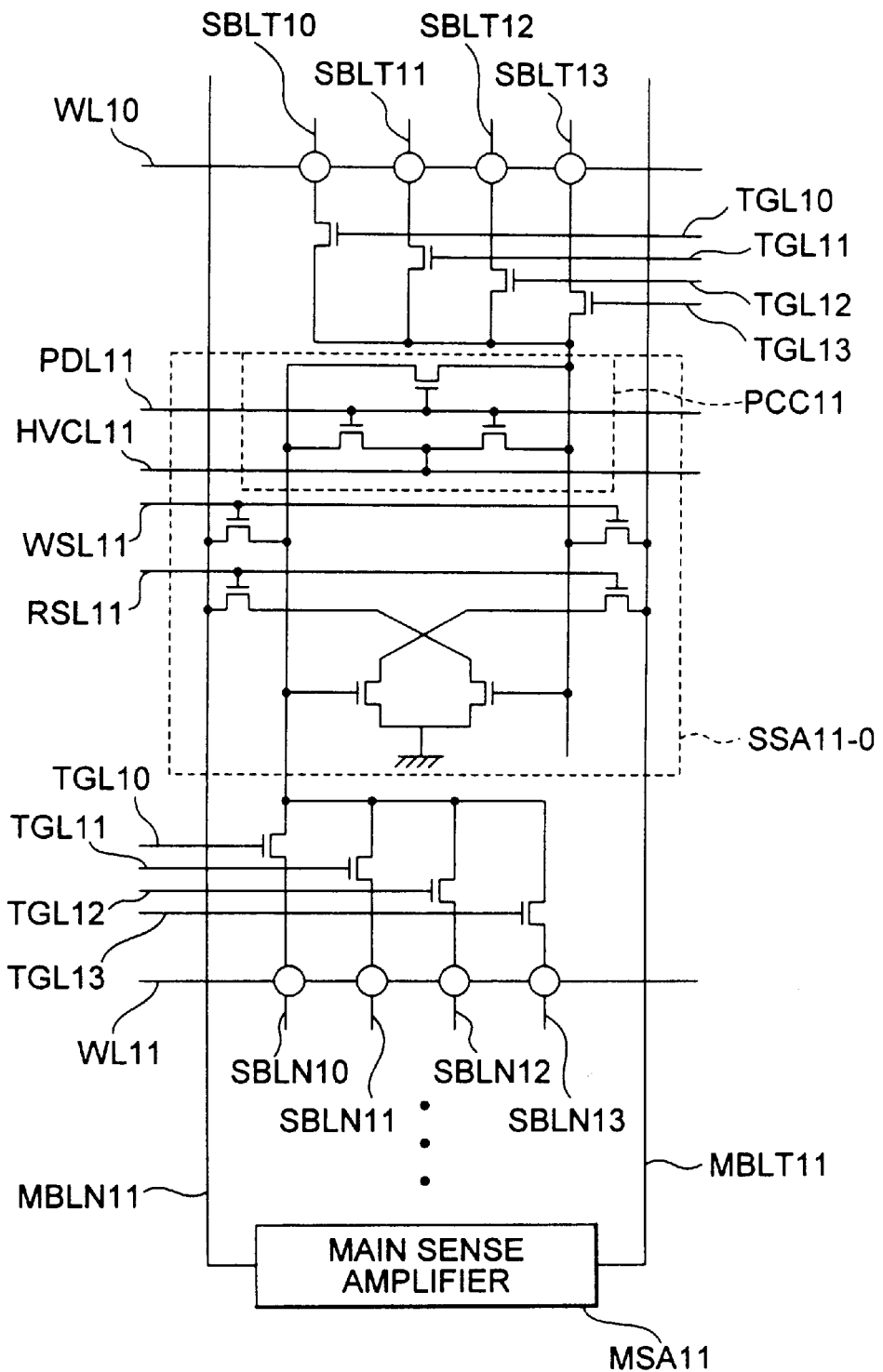
FIG. 1 is a circuit diagram showing a conventional semiconductor memory device.
Figure 2:
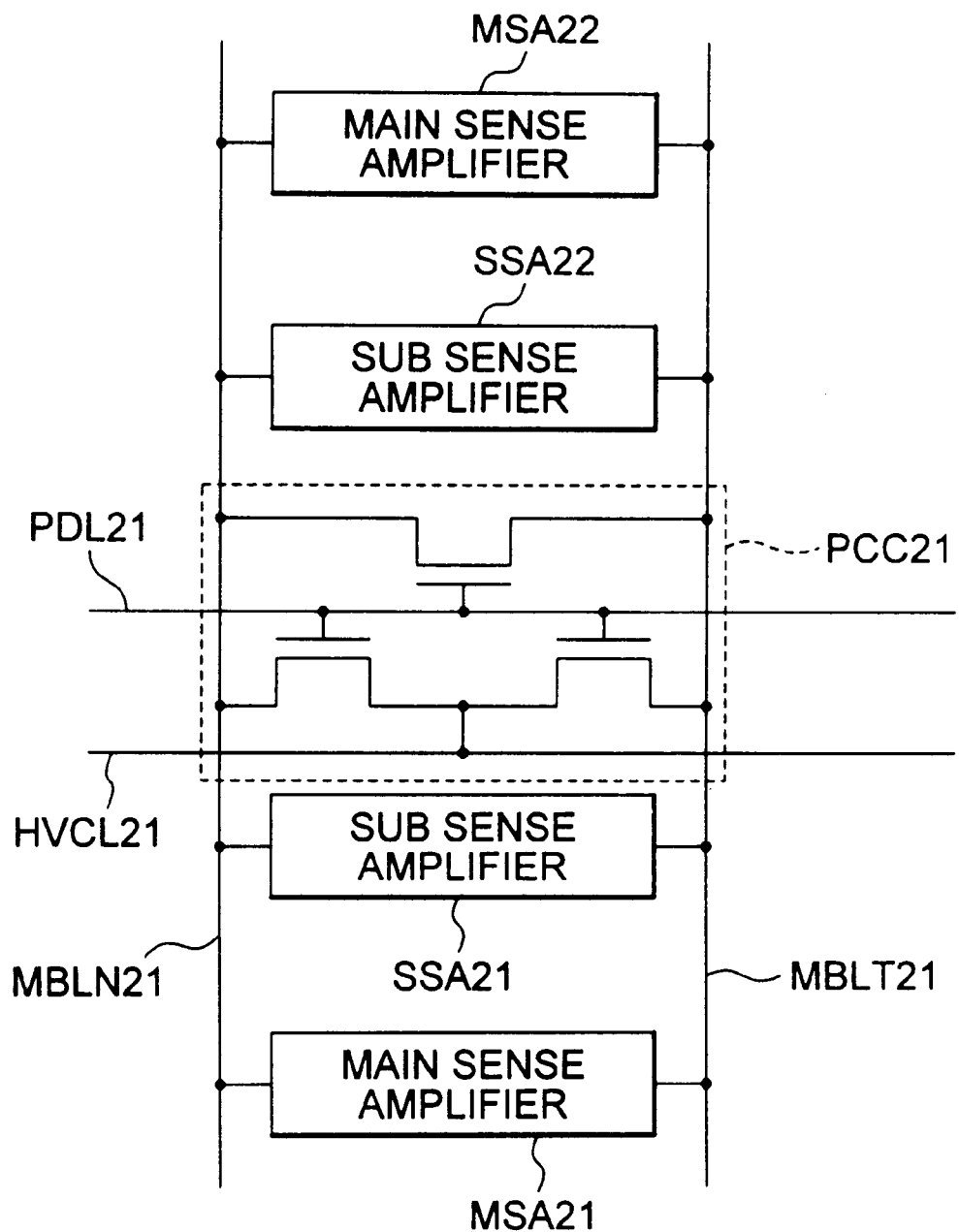
FIG. 2 is a block diagram showing a conventional semiconductor memory device disclosed in the Japanese Patent Application Laid-Open No. Hei 4-274081.
Figure 3:
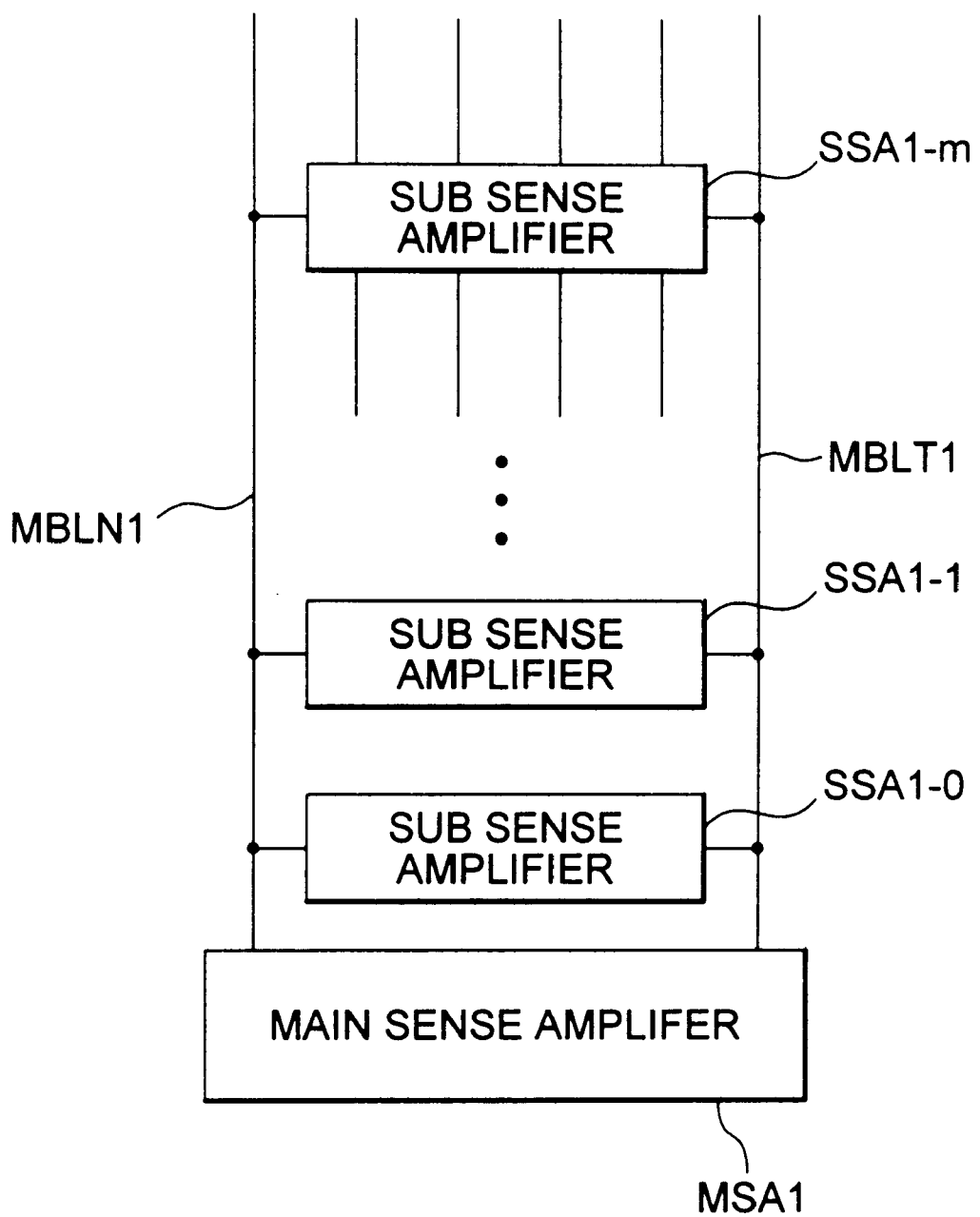
FIG. 3 is a block diagram showing a hierarchy of a semiconductor memory device according to an embodiment of the present invention.

Hereinafter, a semiconductor memory device according to an embodiment of the present invention will be specifically explained by referring to the accompanied drawings. This embodiment is a case in which the semiconductor memory device is applied to a dynamic random access memory (DRAM). FIG. 3 is a block diagram showing a hierarchy of the semiconductor memory device according to the embodiment of the present invention. Furthermore, FIG. 4 is also a circuit diagram showing the semiconductor memory device.

In this embodiment, as shown in FIG. 3, two main bit lines (second bit lines) MBLT1 and MBLN1 are connected to a main sense amplifier (a second sense amplifier) MSA1. Furthermore, (m+1) sub sense amplifiers (first sense amplifiers) SSA1-0, SSA1-1, . . . , SSA1-m are connected between the main bit lines MBLT1 and MBLN1. Four pairs of sub bit lines (first bit lines) are connected to each of the sub sense amplifiers SSA1-0, SSA1-1, . . . , SSA1-m, respectively.

Figure 4:
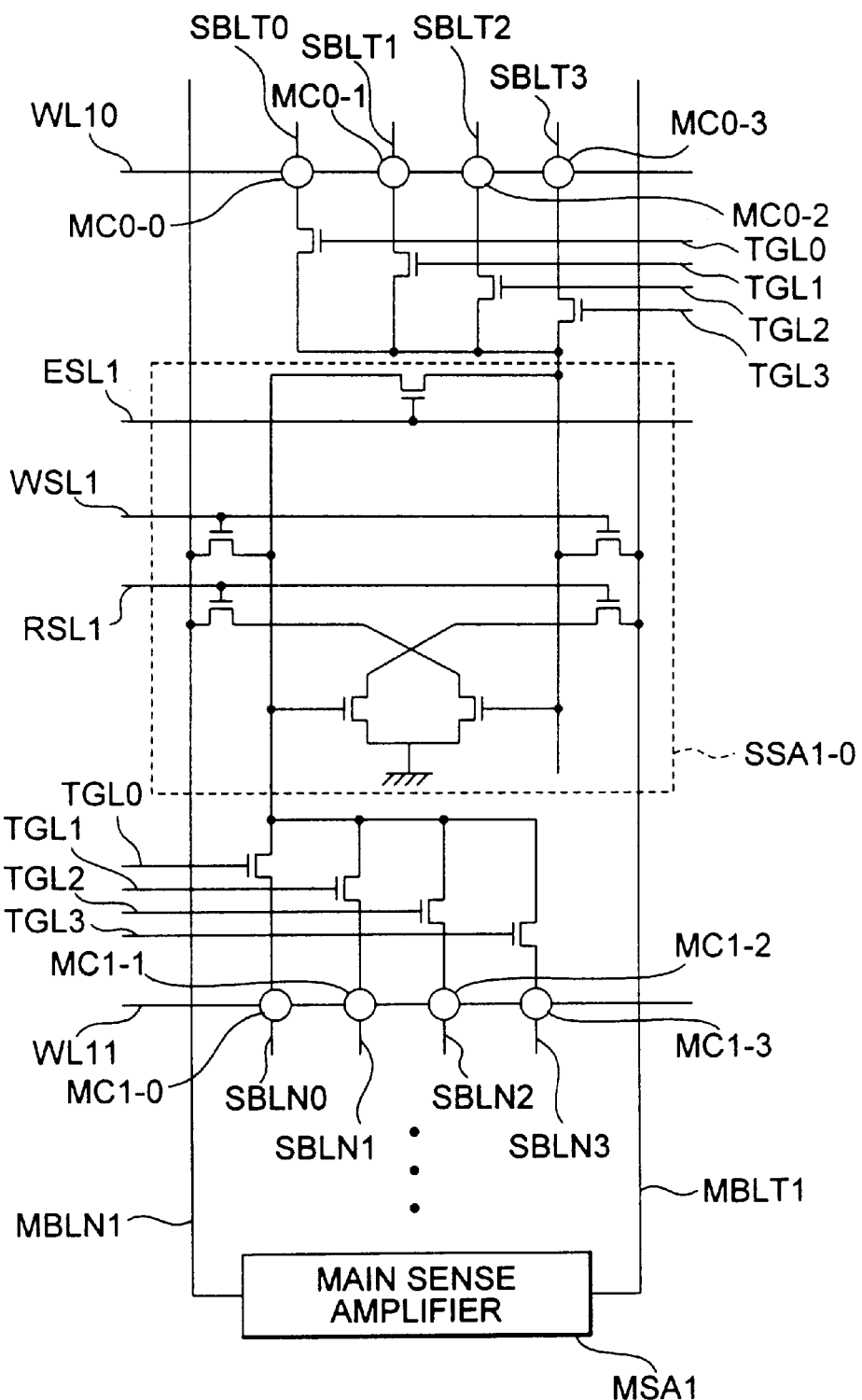
FIG. 4 is also a circuit diagram showing the semiconductor memory device according to the embodiment of the present invention.

For example, as shown in FIG. 4, eight sub bit lines SBLT0, SBLT1, SBLT2, SBLT3, SBLN0, SBLN1, SBLN2, and SBLN3 are connected to the sub sense amplifier SSA1-0. Four sub bit lines SBLT0, SBLT1, SBLT2 and SBLT3A are intersected by a word line WL0. Memory cells MC0-0, MC0-1, MC0-2 and MC0-3 connected to these sub bit lines and the word line are provided on the respective intersection points. Similarly, four sub bit lines SBLN0, SBLN1, SBLN2, and SBLN3 are intersected by a word line WL1. Memory cells MC1-0, MC1-1, MC1-2 and MC1-3 connected to these sub bit lines and the word line are provided on the respective intersection points. One MOS transistor is connected between each of the eight memory cells and the sub sense amplifier SSA1-0. A sub bit line separation signal line TGL0 to which a sub bit line separation signal TG0 are transmitted is respectively connected to each of the gates of two MOS transistors connected between the memory cell MC0-0 or MC1-0, respectively, and the sub sense amplifier SSA1-0. In the same manner, a sub bit line separation signal line TGL1, TGL2 or TGL3 to which a bit line separation signal TG1, TG2 or TG3 is transmitted is connected to each of the gates of the other six MOS transistors. In this manner, in the present embodiment, four sets of sub bit line pairs are connected to the sub sense amplifier SSA1-0, and the sub sense amplifier SSA1-0 is formed in an open bit line structure. A potential difference between each pair of the sub bit line pairs is read and amplified by the sub sense amplifier SSA1-0 (a detecting circuit).

Furthermore, an equalizing-switch signal line ESL1 to which an equalizing-switch signal ES which controls conduction and non-conduction between the sub bit line pairs is transmitted is connected to the sub sense amplifier SSA1-0. A writing switch signal line WSL1 to which a writing-switch signal WS which controls conduction between the main bit lines MBLT1, MBLN1 and four pairs of sub bit lines is transmitted is connected to the sub sense amplifier SSA1-0. A reading switch signal line RSL1 to which a reading-switch signal RS which controls a conduction between main bit lines MBLT1, MBLN1 and two transistors constituting a flip-flop in the sub sense amplifier SSA1-0 is transmitted is connected to the sub sense amplifier SSA1-0.

Figure 5:
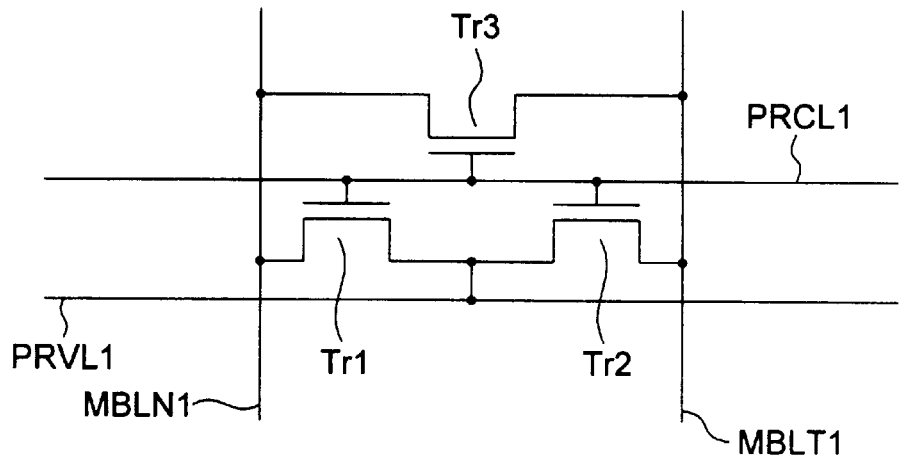
FIG. 5 is a circuit diagram showing a precharge circuit in the embodiment of the present invention.

Incidentally, in this embodiment, a precharge circuit is provided in the main sense amplifier MSA1. FIG. 5 is a circuit diagram showing the precharge circuit in the embodiment of the present invention.

In the precharge circuit, a precharge potential signal line PRVL1 to which a precharge potential PRV is transmitted is provided so as to run at a right angle to the main bit lines MBLT1 and MBLN1. Further, two MOS transistors Tr1 and Tr2 each having one source-drain connected to the precharge potential signal line PRVL1 are provided. The other source-drain of the MOS transistor Tr1 is connected to the main bit line MBLN1, while the other source-drain of the MOS transistor Tr2 is connected to the main bit line MBLT1. Furthermore, a MOS transistor Tr3 having both source-drains connected to the main bit lines MBLN1 and MBLT1, respectively, is provided. Then, a precharge control signal PRCL 1 connected to the respective gates of the MOS transistors Tr1, Tr2 and Tr3 is provided. A precharge signal PRC for controlling balance between the main bit line MBLN1 and MBLT1 and a precharge to the precharge potential PRV is transmitted to the precharge control signal line PRCL 1.

Figure 6:
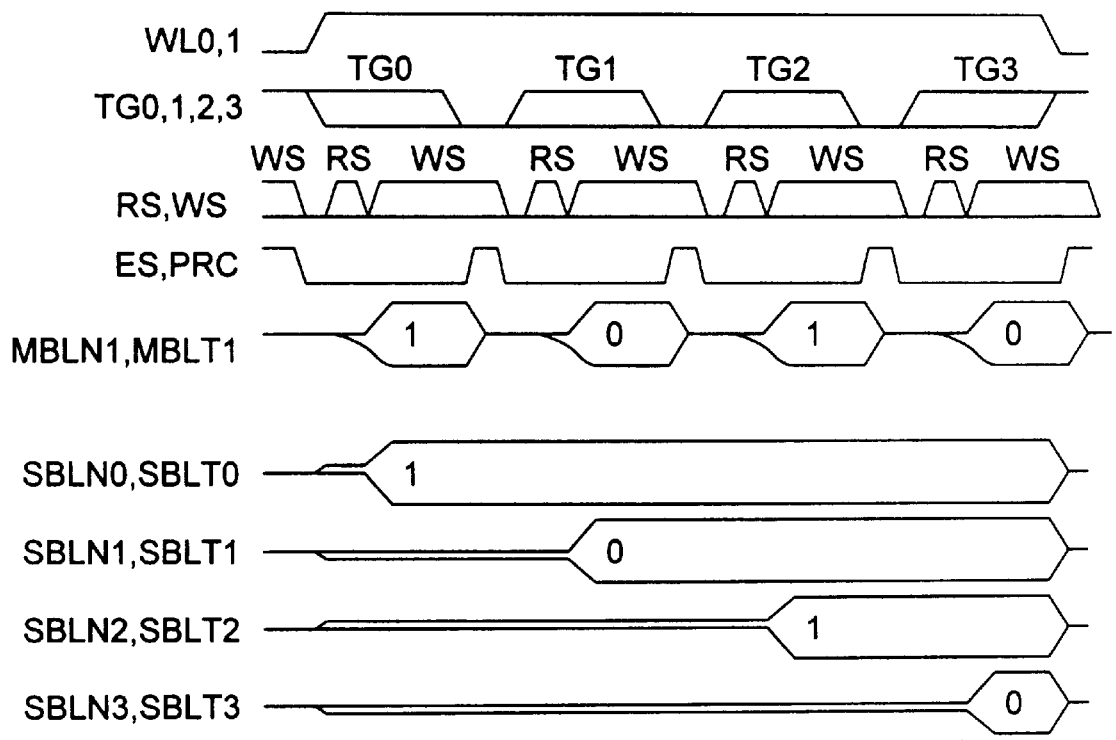
FIG. 6 is a timing chart showing an operation of the semiconductor memory device according to the embodiment of the present invention.

Next, operation of the semiconductor memory device of the embodiment constituted as described above will be explained. FIG. 6 is a timing chart showing operation of the semiconductor memory device according to the embodiment of the present invention.

First, during a precharge period, the respective sub bit line separation signals TG0 through TG3, the writing-switch signal WS, the equalizing-switch signal ES, and the precharge control signal PRC are activated. By the precharge circuit in the main sense amplifier MSA1, the main bit lines MBLN1 and MBLT1 are set to the precharge potential PRV. At this time, the eight sub bit lines SBLT0, SBLT1, SBLT2, SBLT3, SBLN0, SBLN1, SBLN2 and SBLN3 are precharged with the writing-switch signal WS and the equalizing-switch signal ES via the main lines MBLN1 and MBLT1.

After the precharge is completed, the respective sub bit line separation signals TG0 through TG3 are rendered inactive. The word lines WL0 and WL1 are activated, and data in the memory cell MC0-0 is read on the sub bit lines SBLT0 through SBLT3. Furthermore, data in the memory cell MC1-0 is read on the sub bit lines SBLN0 through SBLN3.

Thereafter, only the sub bit line separation signal TG0 is activated, and a potential difference between the sub bit line pairs SBLT0 and SBLN0 is detected and amplified by the sub sense amplifier SSA1-0 (a detecting circuit).

Next, the reading-switch signal RS is activated. Then, the signal which has been amplified by the sub sense amplifier SSA1-0 is transmitted to the main bit lines MBLT1 and MBLN1, and is further amplified by the main sense amplifier MSA1. Then, the writing-switch signal WS is activated. As a consequence, a signal which has been amplified to the maximum amplitude by the main sense amplifier MSA1 is restored in the memory cell MC0-0.

After the restoring operation is completed, the sub bit line separation signal TG0 is rendered inactive in an active state of the writing-switch signal WS. At this time, the equalizing-switch signal ES and the precharge control signal PRC are activated, and the main bit line pairs MBLT1 and MBLN1 as well as detection nodes in the sub sense amplifier SSA1-0 are precharged.

Thereafter, the writing-switch signal WS and the equalizing-switch signal ES are rendered inactive, and only the sub bit line separation signal TG1 is activated. Signals on the sub bit lines SBLT1 and SBLN1 are read and restored.

Furthermore, signals on the sub bit lines SBLT2, SBLN2, SBLT3 and SBLN3 connected the sub bit line separation signal line TGL2 or TGL3, respectively, are read and restored in the same manner.

Then, after restoring of signals to the memory cell MC0-3 is completed, the word lines WL0 and WL1 are rendered inactive. After that, all the sub bit line separation signal lines TG0 through TG3, the writing-switch signal WS, the equalizing-switch ES and the precharge control signal PRC are activated. The sub bit lines SBLT0 through SBLT3 and SBLN0 through SBLN3 are precharged via the main bit lines MBLT1 and MBLN1.

Incidentally, in the present embodiment, the sub sense amplifier having an open bit line configuration is used. However, the sub sense amplifier having a fall-dead bit line configuration may be used.

In this manner, according to the present invention, the precharge circuit for precharging the first bit line pairs is built in the second sense amplifier, and a plurality of the first bit line pairs are shared by the first sense amplifier, so that the chip size can be further finely structured.

What is claimed is:

1. A semiconductor memory device, comprises:
   a plurality of first bit line pairs;
   a plurality of memory cells connected to said first bit line pairs;
   a first sense amplifier which reads and amplifies a potential difference between said first bit line pair;
   a second bit line pair to which a signal output from said first sense amplifier is transmitted;
   a second sense amplifier which amplifies a potential difference between said second bit line pair; and
   a precharge circuit built in said second sense amplifier, said precharge circuit conducting precharge of said first bit line pairs.

2. The semiconductor memory device according to claim 1, wherein said first sense amplifier has an open bit line structure.

3. The semiconductor memory device according to claim 1, wherein said first sense amplifier has a fall-dead bit line structure.

4. The semiconductor memory device according to claim 1, wherein said precharge circuit comprises:
   a precharge potential signal line to which a potential for precharge is transmitted during said precharge, said potential for precharge being applied to said first bit line pairs;
   first and second MOS transistors having source-drain connected to said precharge potential signal line, said first and second MOS transistors being connected in series between said second bit line pair;
   a precharge control signal line which is connected to gates of said first and second MOS transistors, a precharge control signal for controlling said precharge being transmitted to said precharge control signal line; and
   a third MOS transistor whose gate is connected to said precharge control signal line, and whose both of source-drains are connected to said second bit line pair.

5. The semiconductor memory device according to claim 2, wherein the precharge circuit comprises:
   a precharge potential signal line to which a potential for precharge is transmitted during said precharge, said potential for precharge being applied to said first bit line pairs;
   first and second MOS transistors having source-drain connected to said precharge potential signal line, said first and second MOS transistors being connected in series between said second bit line pair;
   a precharge control signal line which is connected to gates of said first and second MOS transistors, a precharge control signal for controlling said precharge being transmitted to said precharge control signal line; and
   a third MOS transistor whose gate is connected to said precharge control signal line, and whose both of source-drains are connected to said second bit line pair.

6. The semiconductor memory device according to claim 3, wherein the precharge circuit comprises:
   a precharge potential signal line to which a potential for precharge is transmitted during said precharge, said potential for precharge being applied to said first bit line pairs;
   first and second MOS transistors having source-drain connected to said precharge potential signal line, said first and second MOS transistors being connected in series between said second bit line pair;

a precharge control signal line which is connected to gates of said first and second MOS transistors, a precharge control signal for controlling said precharge being transmitted to said precharge control signal line; and a third MOS transistor whose gate is connected to said precharge control signal line, and whose both of source-drains are connected to said second bit line pair.

7. The semiconductor memory device according to claim 1, which is used for a dynamic random access memory.

8. The semiconductor memory device according to claim 1, wherein said first sense amplifier has a switching element which controls conduction and non-conduction between said first bit line pair.

* * * * *